(12) United States Patent
Yao et al.

(10) Patent No.: US 8,742,350 B2
(45) Date of Patent: Jun. 3, 2014

(54) PROXIMITY SENSOR

(75) Inventors: Yufeng Yao, Singapore (SG); Sze Ping Ong, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 363 days.

(21) Appl. No.: 12/796,475

(22) Filed: Jun. 8, 2010

(65) Prior Publication Data

US 2011/0297832 A1 Dec. 8, 2011

(51) Int. Cl.
*G01J 5/00* (2006.01)
(52) U.S. Cl.
USPC ........................................ 250/338.1
(58) Field of Classification Search
USPC ........................................ 250/341.8
See application file for complete search history.

(56) References Cited

U.S. PATENT DOCUMENTS

| | | | |
|---|---|---|---|
| 5,528,075 A | 6/1996 | Burns | |
| 5,565,674 A | 10/1996 | Reele | |
| 6,127,671 A * | 10/2000 | Parsons et al. | 250/221 |
| 6,844,562 B2 * | 1/2005 | Takaoka et al. | 250/559.38 |
| 6,958,261 B2 | 10/2005 | Chow et al. | |
| 7,309,855 B2 | 12/2007 | Nagasaka et al. | |
| 7,385,178 B2 | 6/2008 | Chin et al. | |
| 7,485,842 B2 | 2/2009 | Bich et al. | |
| 7,486,386 B1 | 2/2009 | Holcombe et al. | |
| 2004/0240773 A1 * | 12/2004 | Kobinata et al. | 385/14 |
| 2006/0016994 A1 | 1/2006 | Basoor et al. | |
| 2006/0086899 A1 * | 4/2006 | Chao et al. | 250/239 |
| 2006/0237540 A1 | 10/2006 | Saxena | |
| 2007/0252294 A1 * | 11/2007 | Tsuji | 264/1.32 |
| 2008/0219673 A1 * | 9/2008 | Goh et al. | 398/135 |
| 2008/0296478 A1 | 12/2008 | Hemoult | |
| 2009/0027652 A1 * | 1/2009 | Chang et al. | 356/4.01 |
| 2009/0159900 A1 | 6/2009 | Basoor et al. | |
| 2010/0133629 A1 | 6/2010 | Zhang et al. | |
| 2010/0181578 A1 | 7/2010 | Li et al. | |
| 2010/0230599 A1 * | 9/2010 | Yamaguchi et al. | 250/351 |
| 2010/0258712 A1 | 10/2010 | Wiese | |
| 2011/0001223 A1 | 1/2011 | Lee | |

* cited by examiner

*Primary Examiner* — David Porta
*Assistant Examiner* — Edwin Gunberg

(57) ABSTRACT

A proximity sensor includes a printed circuit board (PCB); a first cup and a second cup embedded in the PCB; an electromagnetic radiation transmitter operably mounted in the first cup; and an electromagnetic radiation receiver operably mounted in the second cup.

20 Claims, 4 Drawing Sheets

200

PROXIMITY SENSOR

BACKGROUND

Proximity sensors have long been used to detect the presence of an object that is positioned near the proximity sensor. For example, many modern restrooms have proximity sensors installed in sinks. The presence of a person's hands under the sink faucet is sensed by a proximity sensor which then sends a signal to turn on the water. When the hands are no longer sensed by the proximity sensor the water is turned off.

There are many different types of proximity sensors. One type has a transmitter which transmits electromagnetic radiation of a predetermined wavelength range positioned adjacent to a receiver which is adapted to receive electromagnetic radiation in the predetermined wavelength range and generate a signal indicative of the amount of such electromagnetic radiation that is received. Infrared (IR) radiation transmitters and receivers are often used. In operation, an IR transmitter transmits IR radiation which strikes a nearby object and is reflected by the object back towards the transmitter and receiver. IR radiation reflected by the object onto the receiver is sensed by the receiver which generates a signal indicative of the amount of IR radiation striking it. A signal of sufficient magnitude indicates the likely presence of a nearby object.

DETAILED DESCRIPTION

Proximity sensors are being used in many devices with severe space limitations, thus a proximity sensor which is compact in size may be desirable in many applications. As with virtually all products, manufacturing cost is an important consideration. A design which simplifies or reduces the process steps for producing a proximity sensor is desirable in many applications. The below described proximity sensor may be produced in an extremely compact configuration. The process described herein for producing the proximity sensor involves fewer process steps and is thus less expensive than many proximity sensor production processes currently known in the art. The relatively small size of the, disclosed proximity sensor may also reduce production costs.

A problem experienced by transmitter/receiver type proximity sensors is that not all of the radiation transmitted by the transmitter strikes a target object before being sensed by the receiver. In some cases, radiation is transmitted from the transmitter directly to the receiver without reflection off a target object, as through internal reflection and refraction within the proximity sensor itself. Such "cross talk" interferes with the accuracy of the proximity sensor. The below described proximity sensor addresses the problem of cross talk.

Figure 8:
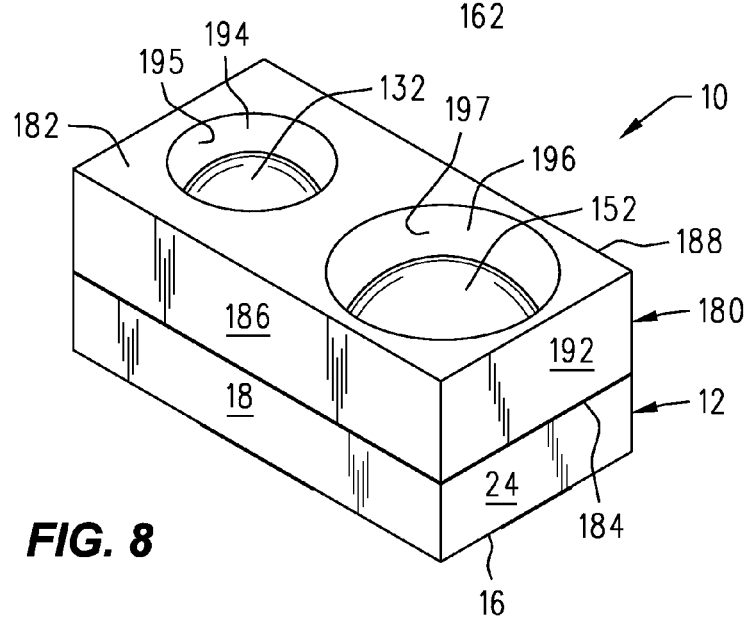
FIG. 8 is a perspective view of an embodiment of a proximity sensor which includes the printed circuit board of FIG. 7 after application of a radiation attenuating layer in a second molding process.
Figure 9:
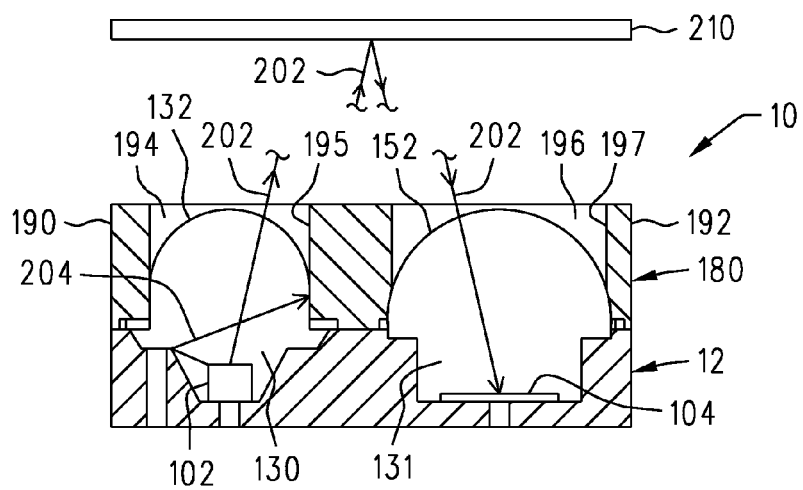
FIG. 9 is a cross sectional view of the proximity sensor of FIG. 8.

FIGS. 8 and 9 show an embodiment of a proximity sensor. The proximity sensor 10 includes a printed circuit board (PCB) 12. As illustrated by FIGS. 1-4, PCB 12 may have a rectangular box shaped configuration with a top surface 14, a bottom surface 16, a front surface 18, a back surface 20, a first lateral side surface (left side surface) 22 and a second lateral side surface (right side surface) 24. In one embodiment, the PBC 12 may have a distance between lateral side surfaces 22, 24 of about 5.2 mm or less; a distance between front and back surfaces 18, 20 of about 2.7 mm or less and a distance between top and bottom surfaces 14, 16 of about 2.2 mm or less. The PCB 12 has a first cavity 32 with an opening 34 in the top surface 14. The opening 34 may have a diameter of about 2.01 mm. The PCB 12 has a second cavity 36 with an opening 38 in the top surface 14 which may have a diameter of about 2.24 mm. The distance between openings 34, 36 may be about 0.58 mm. In one embodiment, the core material of the PBC 12 may be a material which is substantially opaque to infrared radiation, such as bismaleimide triacine resin. The cavities 32, 36 may each be provided by a mechanical drilling process.

It is to be understood that the designations "top", "bottom," etc. are not intended to imply any particular orientation of the proximity sensor 10 in a gravitational field. Rather, these designations are used to establish a frame of reference for describing one or more embodiments of the proximity sensor. The designation "top" is arbitrarily applied to the surface of the PCB 12 that contains the first and second cavity openings 34, 38. Thus, surface 14 remains the "top surface" of the PCB 12 even if the proximity sensor 10 is positioned with surface 14 facing the ground.

A first reflector cup 42 and a second reflector cup 62 which are embedded in the PCB 12 may be provided by applying appropriate coatings to surfaces of the first and second cavities 32, 36, respectfully. The first cup 42 may have a circular opening 43 in the top surface 14 of the PCB 12 corresponding to first cavity opening 34. The first cup 42 may include a first annular lip 44 which is coated with a conductive material such as copper, gold or nickel. The lip 44, which extends transversely with respect to the longitudinal axis of first cup 42, may have an outer diameter of about 1.71 mm and an inner diameter of about 1.11 mm. An annular, upper, tapering wall 45 of the first cup 42 is positioned immediately above the lip 44 and may be coated with highly reflective material such as gold. Below lip 44 is an annular sidewall 46. The sidewall 46 may have a truncated cone shape which tapers inwardly from top to bottom. The diameter of the sidewall 46 at its upper end may be the same as the inner diameter of the lip 44, and the diameter of the sidewall 46 at the bottom may be about half the upper diameter. The depth of the cup wall 45 positioned above the lip 44 may be about 0.20 mm and the depth of the first cup 42 from the lip 44 to a bottom wall 48 of the cup may be about 0.45 mm. The tapering sidewall 46 may be provided with a highly reflective coating such as gold. The circular bottom wall 48 may be coated with a highly reflective coating such as gold. An insulating ring 56 may be positioned between the sidewall 46 and the first lip 44 and another insulating ring 54 may be positioned between lip 44 and upper wall 45. The insulating rings 54, 56 may be made from solder mask and/or the PCB core material.

A second reflective cup 62 may be formed by appropriate coating of portions of second cavity 36. The second cup 62 may have a circular second cup opening 63 in PCB surface 14 corresponding to second cavity opening 38. The second reflective cup 62 may have a second cup annular lip 64 which may be positioned about 0.10 mm below PCB 12 upper surface 14. Second cup lip 64 may be coated with the same conductive material as first cup lip 44. The outer diameter of lip 64 may be about 2.24 mm and the inner diameter of lip 64 may be about 1.64 mm. The second cup 62 may have an upper generally cylindrical wall 65 extending from lip 64 to opening 63. This upper wall 65 may have a surface which is coated with a highly reflective material such as gold. The second cup 62 may have a generally cylindrical sidewall 66 extending from lip 64 to a bottom wall 68. This sidewall 66 may be coated with a highly reflective material such as gold. The distance from the lip 64 to a bottom wall 68 of the second cup 62 may be about 0.55 mm. The bottom wall 68 may be uncoated core material. Insulating rings 70, 77 may be positioned at the inner and outer periphery of lip 64. The insulating rings 70, 77 may be made from solder mask and/or core material.

Figure 1:
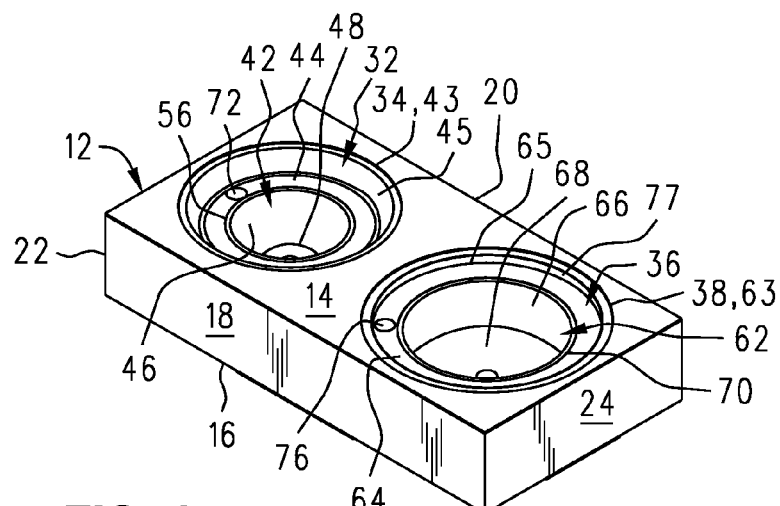
FIG. 1 is a perspective view of an embodiment of a printed circuit board having reflector cups embedded therein.
Figure 2:
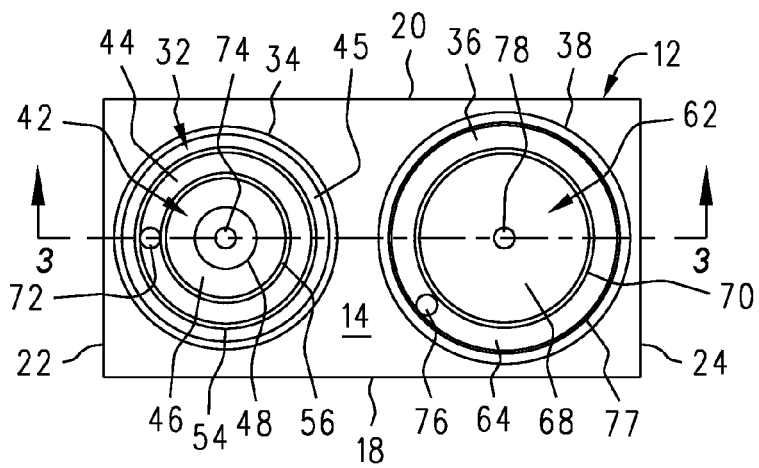
FIG. 2 is a top plan view of the printed circuit board of FIG. 1.
Figure 3:
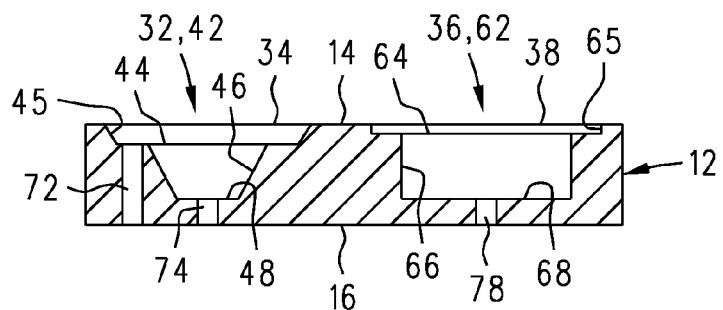
FIG. 3 is a cross sectional view of the printed circuit board of FIGS. 1 and 2.
Figure 4:
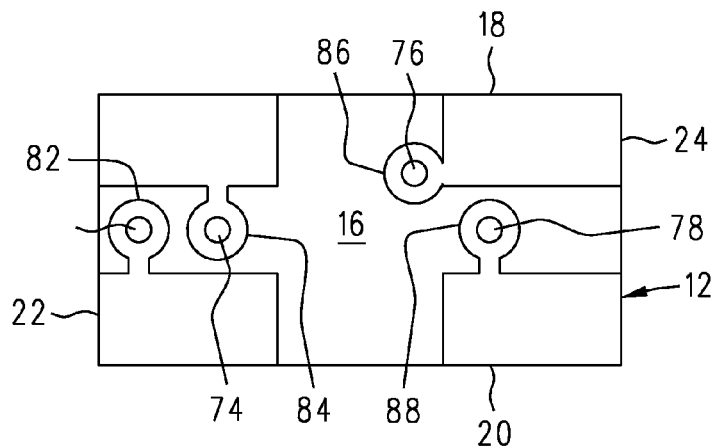
FIG. 4 is a bottom plan view of the printed circuit board of FIGS. 1-3.

First cup 42 has a first via 72 extending from its lip 44 and a second via 74 extending from its bottom wall 48. Second cup 62 may have a third via 76 extending from its lip 64 and a fourth via 78 extending from its bottom wall 68. The vias 72, 74, 76, 78 contain conductive material such as gold. FIG. 4 is a bottom view of PCB 12. FIG. 4 shows that the PCB 12 has bottom conductor pads 82, 84, 86, 88 which are electrically connected to vias 72, 74, 76, 78, respectfully. The bottom surface of the PCB 12 is adapted to be connected to other electrical circuitry for providing power to a transmitter 102 (described below) and for transmitting signals in response to radiation sensed by a receiver 104 (described below). Such proximity sensor circuitry is known in the art and is thus not further described herein.

Figure 5:
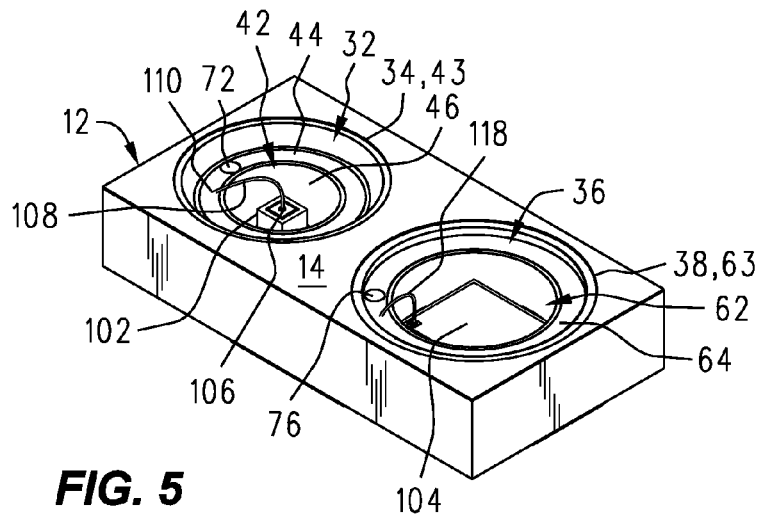
FIG. 5 is a perspective view of the printed circuit board of FIGS. 1-4 with a transmitter mounted in one reflector cup and a receiver mounted in a second reflector cup.
Figure 6:
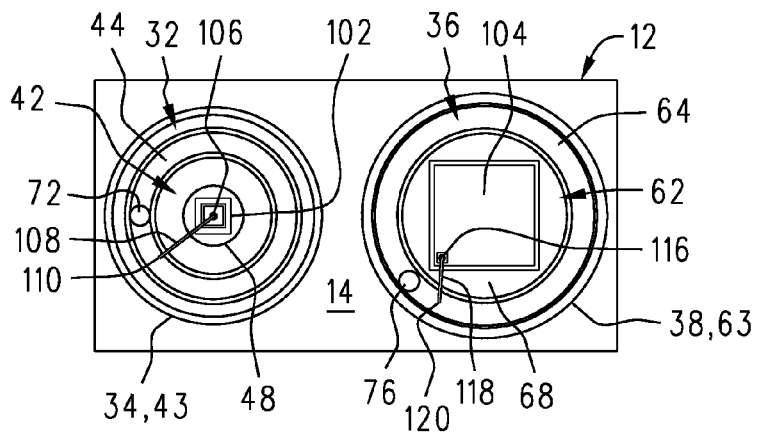
FIG. 6 is a top plan view of the printed circuit board of FIG. 5.

As illustrated in FIGS. 5 and 6, an electromagnetic radiation transmitter 102 is mounted in the first cup 42 on the inner uncoated area 54 of the bottom wall 48 with a terminal (not shown) positioned at the bottom of the transmitter 102 in electrical connection with via 74. This connection may be made with a conventional conductive thermoset material. A second terminal 106 of the transmitter 102 may be electrically connected, as by wire bonding with a gold wire, to connection point 110 on first cup lip 44. The transmitter 102 may be an LED type infrared (IR) transmitter, such as Model Number TK1141RA manufactured by TYNTEK.

An electromagnetic radiation receiver 104 is mounted on the bottom wall 68 of the second cup 62 with a terminal on the bottom of the receiver 104 connected to via 78 as by conventional thermoset material. A second terminal 116 on IR receiver 104 may be wire bond connected, as by wire 118, which may be a gold wire, to a connection point 120 on lip 64. The receiver 104 may be an IR detecting photodiode that generates a signal proportionate to the IR that is detected, for example Model Number TK043PD manufactured by TYN-TEK.

It will be appreciated by those having skill in the art after reading this specification that the transmitter 102 and receiver 104 may be variously otherwise electrically connected to electrodes associated with power and control circuitry. For example, second cup lip 64 could be separated into two electrically isolated portions with a different via associated with each separate portion. The receiver 104 could have both of its terminals on its upper surface. These terminals could each be connected to a different one of the electrically isolated portions of the lip. As a further example, first cup 42 could have a second via extending through first cup bottom wall 48 rather than through first cup lip 42. The top terminal 106 of the transmitter 102 could be operably connected to this second via in the bottom wall 48. Other now known or future developed electrical connection methods may also be employed.

Figure 7:
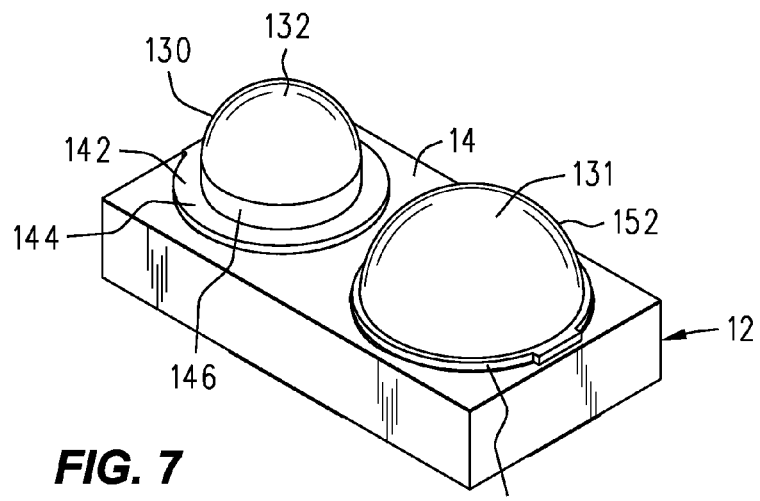
FIG. 7 is a perspective view of the printed circuit board of FIGS. 5 and 6 after application of an encapsulant in a first molding operation.

The proximity sensor 10, in one embodiment, is formed by applying two separate molding processes to PCB 12 after transmitter 102 and receiver 104 are operably mounted in cups 42, 62, respectively. In a first molding process, the first cup 42 is entirely filled with a first encapsulant 130 which is poured into the first cup 42, FIG. 7. Thus, the transmitter 102 is entirely covered with encapsulant 130. The encapsulant 130 is substantially transparent to the electromagnetic radiation transmitted by transmitter 102 and may be appropriately tinted to eliminate most electromagnetic radiation of other wave lengths. Thus, in the case of an IR transmitter, the encapsulant is substantially transparent to IR radiation and blocks most other wavelengths. One commercially available encapsulant of this type is Model Number NT8506 manufactured by Nitto Denko. A typical curing time and temperature for this product is 0.5 hours at 150° C. As illustrated by FIG. 7, during this first molding process the encapsulant 130 extends over the top opening 43 of the first cup 42 and is formed into a dome shaped lens 132, in part through the use of a molding ring 142, which comprises a laterally extending rim portion 144 and an upright rim portion 146. The lens 132 may extend to a height of 1.20 mm above PCB top surface 14 and may have a radius or curvature above ring portion 146 of about 0.80 mm. Ring portion 146 may have the same diameter as the first cup opening 43.

As also shown by FIG. 7, the second cup 62 may be entirely filled with encapsulant 131 which may be the same type as encapsulant 130 used to fill the first cup 42. Encapsulant 131 is substantially transparent to the radiation produced by transmitter 102 and is thus substantially transparent to IR radiation in the case where transmitter 102 is an IR transmitter and receiver 104 is an IR receiver. The encapsulant 131 completely covers the receiver 104 and extends above PCB upper surface 14 to form a second dome shaped lens 152. Formation of lens 152 may be assisted as by molding ring 162. The second dome shaped lens 152 may have a diameter, where it interfaces with top surface 14, of about 2.24 mm. Lens 152 may extend above surface 14 of the PCB 12 about 1.20 mm, and may have a radius or curvature of about 1.12 mm. Application of encapsulant 131 to the second cup 62 may occur at the same time and in the same molding process as application of encapsulant 130 to the first cup 42. The encapsulant 130 and encapsulant 131 may be identical material.

In some embodiments (not shown) the encapsulant 130, 131 may fill cups 42, 62, respectively, but no lens is formed above either cup or only one lens if formed above one of the cups 42, 46.

FIGS. 8 and 9 illustrate a layer 180 which interfaces with the top surface 14 of PCB 12 and has been bonded to PCB 12 in a second molding process. In one embodiment, the layer 180 may be bonded to the PCB 12, without removing rings 142, 162. The layer 180 may be applied in a transform molding process wherein the layer 180 and the PCB 12 are placed in interfacing contact and are heated under high pressure. The layer 180 is a substance which is substantially opaque to the electromagnetic radiation produced by transmitter 102. Thus in the case of an IR transmitter, the layer 180 is a substantially IR opaque substance such as Part Number NT8570 manufactured by Nitto Denko. Layer 180 may have generally flat surfaces including a top surface 182, a bottom surface 184, front surface 186, back surface 188, first lateral side surface 190, and second lateral side surface 192. In one embodiment, layer 180 has a height of 1.25 mm, a width of 2.70 mm, and a length of 5.20 mm. Layer 180 may have a first cylindrical aperture 194 therein aligned with first cavity 32 and lens 132. A peripheral portion of lens 132 may be bonded to the inner wall 195 of first cylindrical aperture 194 during the molding process. The bottom surface 184 of layer 180 may be bonded to top surface 14 of PCB 12 during the molding process. A second cylindrical aperture 196 is similarly situated over second cavity 36 and has a sidewall 197 bonded to a peripheral portion of second dome shaped lens 152 when the layer 180 is molded to PCB 12. The diameter of the first cylindrical aperture 194 may be about 1.70 mm and the diameter of the second cylindrical aperture 196 may be about 2.34 mm. First and second cylindrical apertures 194, 196 may be produced by conventional molding tools and processes known in the art. The particular molding process used to form layer 180 may be a transform molding process, however various other molding processes known in the art, such as cast molding, may also be used.

The proximity sensor embodiment described above with reference to FIGS. 1-8, may thus have a very compact configuration, e.g. the overall dimensions of the proximity sensor 10 may be about 5.2 mm×2.7 mm×2.2 mm. Thus, the entire volume of the proximity sensor 10 may be less than about 31 mm$^3$. The above described process for making a proximity sensor is also relatively simple and inexpensive.

FIG. 9 is a cross sectional view which shows the interior features of the proximity sensor 10 and its operation. A ray 202 of radiation from the transmitter 102, which is directed generally upwardly, passes through the encapsulant 130 in cup 42, through lens 132 and through aperture 194. The ray 202 is reflected by a reflective body 210 (target object 210) positioned within a predetermined distance of the proximity sensor (e.g., 50 cm). After reflection from body 210, the ray 202 is transmitted through aperture 196, lens 152 and encapsulant 131 in second cup 62, and then strikes receiver 104. The lenses are configured such that radiation from transmitter 102 which is directed generally upwardly is collimated and focused in a predetermined upward direction and radiation that travels generally downwardly and enters lens 152 is collimated and focused on receiver 104. Receiver 104 generates a signal proportionate to the amount of radiation, within a predetermined wavelength range, it receives.

FIG. 9 also shows a second ray 204. Ray 204 is transmitted from transmitter 102 in a first generally lateral direction and then reflects off a reflective sidewall 46 of the first cup 42. After reflection from the sidewall 46, ray 204 travels in a second generally lateral direction into a sidewall 195 of aperture 194 which attenuates ray 204. If the layer 180 had not been present, the ray 204 may have entered lens 152 and then, through refraction and/or reflection, may have been directed to the surface of receiver 104. Thus, in the above situation, layer 180 attenuates most electromagnetic radiation transmitted by transmitter 102, such as ray 204, which has not been reflected from a target object 210 positioned in alignment with proximity sensor 10 and within a predetermined distance (e.g., 50 cm) of the proximity sensor 10. It will also be appreciated that the sidewall 197 of aperture 196 attenuates radiation from transmitter 102 that may have been reflected from surfaces other than the target object 210, such as objects positioned adjacent to the target object 210 but not in alignment with aperture 196 and lens 152, as well as ambient radiation, i.e., radiation from radiation sources other than transmitter 102. Thus, layer 180 attenuates a substantial amount of "cross talk" that may otherwise interfere with the operation of the proximity sensor 10.

Figure 10:
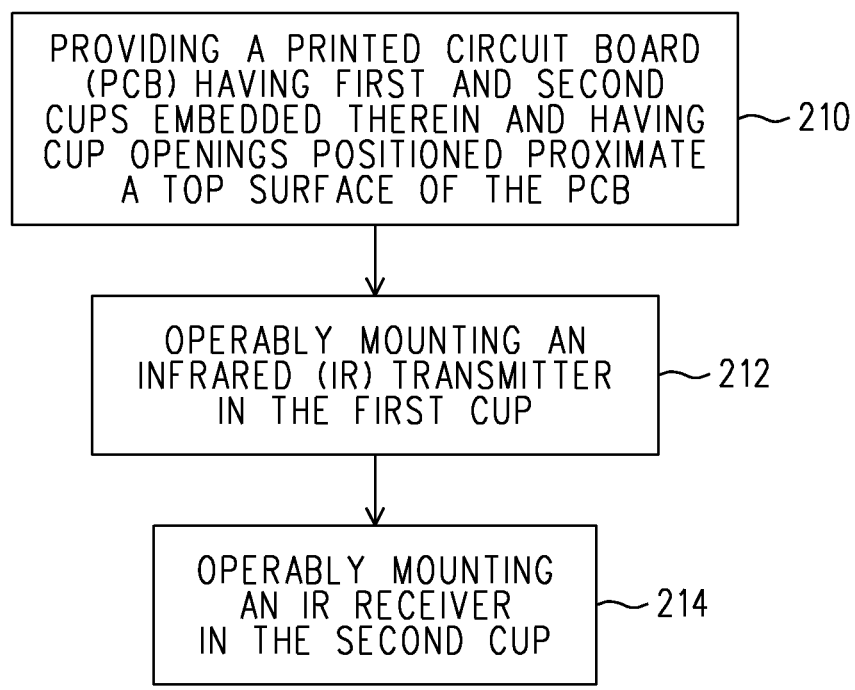
FIG. 10 is a flow chart illustrating an embodiment of a method of making a proximity sensor.

FIG. 10 illustrates one embodiment of a method for making a proximity sensor that includes, as shown at 210, providing a printed circuit board (PCB) with first and second cups embedded in the PCB and having cup openings positioned proximate a top surface of the PCB. The method also includes, as shown at 212, operably mounting an infrared (IR) transmitter in the first cup. The method further includes, as shown at 214, operably mounting an IR receiver in the second cup.

In another embodiment of a method for making a proximity sensor, the method may include the method illustrated in FIG. 10 and may further include covering the IR transmitter and the IR receiver with an encapsulant that is substantially transparent to IR and molding a first lens projecting above the top surface of the PCB from the encapsulant covering the IR transmitter and molding a second lens projecting above the top surface of the PCB from the encapsulant covering the IR receiver.

In another embodiment of a method for making a proximity sensor, the method may include the method illustrated in FIG. 10 and may further include overlaying the top surface of the PCB with a layer of substantially IR opaque material having a first aperture aligned with the first cup and a second aperture aligned with the second cup.

In another embodiment of a method for making a proximity sensor, the method may include the method illustrated in FIG. 10 and may further include providing a printed circuit board (PCB) with first and second cups embedded therein and having cup openings proximate a top surface of the printed circuit board comprises providing the first and second cups with gold on interior surfaces thereof.

In another embodiment of a method for making a proximity sensor, the method may include the method illustrated in FIG. 10 and providing a PCB may include providing contacts on a bottom surface of the PCB that are electrically connectable to power and control circuitry.

In another embodiment of a method for making a proximity sensor, the method may include the method illustrated in FIG. 10 and operably mounting the IR transmitter in the first cup may include connecting a terminal on the bottom of the IR transmitter with an electrical contact at the bottom of the first cup and wire bond connecting another terminal of the IR transmitter with an electrical contact on a lip of the first cup.

A proximity sensor of the typed described herein may be used in conventional applications such as restroom toilets, sinks, towel dispensers, and hand driers as well as vending machines and industrial machinery, etc. Its small size also makes it desirable for use in many different portable devices such as cellular and cordless telephones, laptop and notebook computers, digital touch screen devices, handheld electronic games, digital cameras, GPS units and many other handheld or portable devices. For example proximity sensor 10, shown in FIG. 9, may be mounted in the keyboard of any one of the electronic devices listed above and may be used to activate the device when a target object 210 such as a user's hand comes within some preset distance of the keyboard.

The above description has been presented for purposes of illustration and description. It is not intended to be exhaustive or to limit the invention to the precise form disclosed. Various other embodiments and modifications will be obvious to those skilled in the art after reading this disclosure, and it is intended that the appended claims be construed to cover such other embodiments and variations except insofar as limited by the prior art.

What is claimed is:

1. A proximity sensor comprising:
 a printed circuit board (PCB);
 a first cup and a second cup embedded in the PCB, at least one of the first and second cups comprising an annular tapering wall that is coated with a reflective material;
 an electromagnetic radiation transmitter operably mounted in the first cup;
 an electromagnetic radiation receiver operably mounted in the second cup;
 encapsulant, which is transparent to electromagnetic radiation transmitted by the transmitted, encapsulating the transmitter and the receiver, the encapsulant substantially filling the first cup and the second cup, the encapsulant further forming at least one lens above at least one of the first cup and the second cup;
 an opaque layer, which attenuates electromagnetic radiation transmitted by the transmitter, positioned in overlying relationship with the PCB and having a first aperture aligned with the first cup and a second aperture aligned with the second cup; and
 at least one molding ring positioned in overlying relationship with at least one of the first aperture and second aperture, the at least one molding ring comprising a laterally extending rim portion and an upright rim portion that are used to form the at least one lens above at least one of the first cup and the second cup, wherein the at least one molding ring is situated between the opaque layer and the PCB.

2. The proximity sensor of claim 1, wherein the at least one lens comprises a first lens formed above the first cup and wherein the first lens is bonded to an inner wall of the first aperture.

3. The proximity sensor of claim 1, wherein the at least one lens further comprises a second lens formed above the second cup and wherein the second lens is bonded to an inner wall of the second aperture.

4. The proximity sensor of claim 1,wherein the opaque layer is bonded with a top surface of the PCB.

5. The proximity sensor of claim 4, wherein the at least one lens comprises a first lens that extends above the top surface of the PCB into the first aperture as well as a second lens that extends above the top surface of the PCB into the second aperture, wherein the first lens is bonded to an inner wall of the first aperture, and wherein the second lens is bonded to an inner wall of the second aperture.

6. The proximity sensor of claim 1, wherein both the first and second cups comprise an annular tapering wall that is coated with the reflective material, the first cup comprising a first annular lip that is coated with a conductive material and is insulated from the reflective material of the first cup's annular tapering wall by a first insulating ring, the second cup comprising a second annular lip that is coated with the conductive material and is insulated from the reflective material of the second cup's annular tapering wall by a second insulating ring.

7. The proximity sensor of claim 1, wherein the at least one lens is bonded to a cylindrical inner wall of the opaque layer.

8. A proximity sensor comprising:
 a printed circuit board (PCB) having a top surface and a bottom surface and having a first cavity and a second cavity, the cavities having first and second openings, respectively, in the top surface;
 first and second cups provided in the first and second cavities, respectively;
 an infrared (IR) transmitter operably mounted in the first cup;
 an IR receiver operably mounted in the second cup;
 encapsulant substantially transparent to IR radiation substantially filling each of the cups and forming a lens above each of the cups that fills and extends above the top surface of the PCB, wherein the lens above at least one of the first and second cups is formed, at least in part, by a molding ring that rests upon the top surface of the PCB and is configured to shape the lens above the top surface of the PCB; and
 a layer of material substantially opaque to IR radiation overlying the top surface of the PCB, the layer having a first aperture aligned with and at least partially surrounding a portion of the lens that extends from the first cup above the top surface and a second aperture aligned with and at least partially surrounding a portion of the lens that extends from the second cup above the top surface, wherein the molding ring is positioned between the layer of material substantially opaque to IR radiation and the PCB.

9. The proximity sensor of claim 8, comprising contacts on the bottom surface of the PCB configured to connect the PCB to power and control circuitry.

10. The proximity sensor of claim 8, wherein a first terminal of the IR transmitter is electrically connected to a bottom portion of the first cup and the bottom surface of the PCB through a via, the first cup further comprising:
 a contact on a lip of the first cup which is electrically connected to a second terminal of the IR transmitter, the contact on the lip of the first cup being electrically insulated from the first terminal by at least one insulating ring positioned in the first cup.

11. The proximity sensor of claim 8, the second cup comprising:
 a contact at a bottom portion thereof which is electrically connected to a first terminal of the IR receiver; and
 a contact on a lip of the second cup which is electrically connected to a second terminal of the IR receiver, the contact on the lip of the second cup being electrically insulated from the second terminal by at least one insulating ring positioned in the second cup.

12. The proximity sensor of claim 8, wherein at least one of the first and second cups comprise a highly reflective coating on an interior surface thereof and the first cup comprises an insulating ring configured to electrically insulate a bottom portion of the first cup from an annular lip of the first cup that extends transversely with respect to a longitudinal axis of the first cup.

13. The proximity sensor of claim 8, wherein the PCB and the layer of material substantially opaque to IR radiation each comprise a thickness extending perpendicular to the top surface of the PCB, the thickness of the layer of material being greater than the thickness of the PCB.

14. The proximity sensor of claim 8, wherein the layer of material opaque to IR radiation is bonded to the top surface of the PCB.

15. A method for making a proximity sensor comprising:
 providing a printed circuit board (PCB) with first and second cups embedded therein and having cup openings proximate a top surface of the PCB;
 operably mounting an infrared (IR) transmitter in the first cup;
 operably mounting an IR receiver in the second cup;
 filling the first cup and second cup with an encapsulant;
 forming at least one lens with the encapsulant, the at least one lens being formed within and extending above at least one of the first cup and the second cup, wherein the at least one lens is formed with the use of a molding ring which comprises a laterally extending rim portion and an upright rim portion having a diameter substantially equal to a diameter of at least one of the first and second cup openings; and overlaying the top surface of the PCB with a layer of substantially IR opaque material having a first aperture aligned with the first cup and a second aperture aligned with the second cup, wherein the layer of substantially IR opaque material is overlayed on the PCB without removing the molding ring.

16. The method of claim 15, wherein operably mounting the IR transmitter in the first cup comprises connecting a terminal on the bottom of the IR transmitter with an electrical contact at the bottom of the first cup and connecting by wire bonding another terminal of the IR transmitter with an electrical contact on a lip of the first cup, wherein the electrical contact on the bottom of the first cup is electrically connected to a bottom surface of the PCB through an electrically-conductive via that extends through the PCB, and wherein the electrical contact at the bottom of the first cup is insulated from the electrical contact on the lip of the first cup by an insulating ring.

17. The method of claim 15, further comprising covering the IR transmitter and the IR receiver with an encapsulant that is substantially transparent to IR and molding a first lens projecting above the top surface of the PCB from the encapsulant covering the IR transmitter and molding a second lens projecting above the top surface of the PCB from the encapsulant covering the IR receiver.

18. The method of claim 15, wherein the at least one lens comprises a first lens formed within and extending above the first cup and a second lens formed within and extending above the second cup, wherein the first lens is bonded to an inner cylindrical wall of the first aperture and wherein the second lens is bonded to an inner cylindrical wall of the second aperture.

19. The method of claim 15, wherein providing a PCB with first and second cups embedded therein and having cup openings proximate a top surface of the printed circuit board comprises providing the first and second cups with gold on interior surfaces thereof and insulating rings on the interior surfaces thereof.

20. The method of claim 15, wherein providing a PCB comprises providing contacts on a bottom surface of the PCB that are electrically connectable to power and control circuitry.

\* \* \* \* \*